United States Patent [19]

Ishii

[11] Patent Number: 5,373,113

[45] Date of Patent: Dec. 13, 1994

[54] SOLDER REFLOW MOUNTING BOARD

[75] Inventor: Hideki Ishii, Itami, Japan

[73] Assignee: Mitsubishi Denki Kabushiki Kaisha, Tokyo, Japan

[21] Appl. No.: 53,699

[22] Filed: Apr. 29, 1993

[30] Foreign Application Priority Data

May 1, 1992 [JP] Japan ................. 4-139804

[51] Int. Cl.5 ........................................... H05K 1/02
[52] U.S. Cl. ......................... 174/261; 361/767; 361/771
[58] Field of Search ............... 174/250, 261; 361/767, 361/771, 760; 439/81, 83

[56] References Cited

U.S. PATENT DOCUMENTS

| | | | |
|---|---|---|---|
| 4,339,785 | 7/1982 | Oshawa | 361/411 |
| 4,767,892 | 8/1988 | Robari | 174/68.5 |
| 4,901,135 | 2/1990 | Neugebauer et al. | 357/75 |
| 5,066,544 | 11/1991 | Betrabet et al. | 428/614 |
| 5,184,767 | 12/1991 | Estes | 228/56.3 |
| 5,250,757 | 10/1993 | Kawakami | 174/250 |

*Primary Examiner*—Leo P. Picard
*Assistant Examiner*—L. Thomas
*Attorney, Agent, or Firm*—Leydig, Voit & Mayer

[57] ABSTRACT

A process for reflow mounting an electronic component includes coating a terminal electrode on a mounting board with a second solder having a second melting point higher than a reflow temperature, placing the mounting board with the electronic component on a mounting land on a conveyor which may be brought into contact with the second solder on the terminal electrode, and heating the mounting board to the reflow temperature. The terminal electrode may be coated with a solder repelling material at a selected dividing area effective for dividing the terminal electrode into a plurality of sections substantially isolated from each other in terms of solder flow. Alternatively, a mounting jig may be used for supporting the mounting board without bringing the second solder on the terminal electrode into contact with the mounting jig.

6 Claims, 4 Drawing Sheets ns such as IC packages. In these figures, the mount-
SOLDER REFLOW MOUNTING BOARD

BACKGROUND OF THE INVENTION

This invention relates to reflow mounting of an electronic component on a mounting board and, more particularly, to a process and a mounting board for the reflow mounting.

FIGS. 7 and 8 illustrate one example of a conventional mounting board for mounting electronic components such as IC packages. In these figures, the mounting board comprises a substantially rectangular, electrically insulating substrate 1, a plurality of terminal electrodes 2 disposed on the major surfaces of the substrate 1 for external connection and a plurality of mounting lands 3 disposed on one of the major surfaces of the substrate 1 for mounting the electronic component. Although not illustrated, the terminal electrodes 2 and the mounting lands 3 are electrically connected to define an electrical circuit on the substrate 1. Each of the terminal electrodes 2 is coated with a solder layer 2a formed by the hot leveller process or the electrolyte plating method for the main purpose of protecting the terminal electrodes 2 against corrosion.

When it is desired to mount electronic components such as IC packages on the mounting lands 3 by the reflow process, each of the mounting lands 3 is coated with a printed solder paste layer 3a suitable for reflow process. The solder paste layer 3a has a melting point of about 183° C. which is lower than a reflow temperature which is between 190° C. and 210° C. and which is almost equal to the melting point of the solder of the solder layer 2a on the terminal electrodes 2. The solder paste contains a solder of Sn 40% and Pb 60% with a small amount of flux.

Then, as illustrated in FIG. 10 the electronic components 4 to be mounted on the mounting board are placed on the solder layers 3a of the respective mounting lands 3 and the mounting board is placed on support pins 5a and 5b of a chain conveyor 5. It is seen from FIG. 10 that the support pins 5a are brought into contact with the protective solder 2a on the terminal electrodes 2 on the bottom side of the insulating substrate 1. The support pins 5b directly engage the bottom major surface of the insulating substrate 1.

As the mounting board on which the electronic components 4 are placed is passed through a reflow heating station and heated by a flow of hot air to about 190° C. to 210° C. the peak temperature, the solder layers 3a between the mounting lands 3 and the electronic components 4 melt and then are cooled to electrically and mechanically connect the electronic components 4 on the mounting lands 3 on the mounting board.

During this reflow heating process, the protective solder layers 2a on the terminal electrodes 2 also melt because the melting point of this solder 2a is substantially equal to that of the reflow solder 3a on the mounting lands 3 and is lower than the reflow temperature which usually is about 190° C. to 210° C., the peak temperature. Since the mounting board is supported by the support pins 5a and 5b of the chain conveyor 5, some of the support pins 5a are brought into contact with the molten solder 2a.

Therefore, the rate of the temperature rise rate and the cooling rate of the terminal electrode portion are very different from position to position and the molten solder 2a on the terminal electrodes 2 is collected and concentrated on a particular local position on the terminal electrodes 2 due to wetting. This causes the solidified solder layer 2a to have a very non-uniform thickness and irregular surface, whereby the mounting boards thus manufactured have a thickness different from one board to another and an ugly appearance which degrades the commercial value of the circuit boards. Accordingly, when the terminal electrodes 2 have such an irregular solder surface, the solder layers 2a on the terminal electrodes 2 had have to be corrected by hand.

SUMMARY OF THE INVENTION

Accordingly, one object of the present invention is to provide a reflow mounting process and a mounting board particularly useful for use in the process which are free from the above described drawbacks of the conventional reflow mounting process.

Another object of the present invention is to provide a reflow mounting process in which the terminal electrodes on the mounting board do not have to be amended.

A further object of the present invention is to provide a mounting board that eliminates the need for the protective solder layer to be corrected after reflow mounting.

Another object of the present invention is to provide a mounting jig that is particularly useful when used in the reflow mounting process of the present invention.

With the above objects in view, the process for reflow mounting an electronic component on a mounting board of the present invention comprises the steps of: preparing a mounting board including a terminal electrode for external connection and a mounting land for mounting an electronic component thereon; coating the mounting land with a first solder having a first melting point lower than a reflow temperature; coating the terminal electrode with a second solder having a second melting point higher than the reflow temperature; placing the mounting board, with the electronic component placed on the mounting land, on a conveyor which may be brought into contact with the second solder on the terminal electrode; and heating the mounting board together with the electronic component thereon to the reflow temperature. The first melting point may be 183° C., the second melting point may be between 290° C. to 300° C. and the reflow temperature may be from 190° C. to 210° C. the peak temperature. The first solder may contain a solder paste including a solder including 40% Sn and 60% Pb and a flux, the second solder may contain 5% Sn, 2.5% Ag and 92.5% Pb.

The mounting board of the present invention for reflow mounting an electronic component on a conveyor which may be brought into contact with the mounting board comprises: an electrically insulating substrate; a terminal electrode disposed on the substrate for external connection and a mounting land disposed on the substrate for mounting an electronic component thereon; a first solder disposed on the mounting land, the first solder having a first melting point lower than a reflow temperature; and a second solder disposed on the terminal electrode, the second solder having a second melting point higher than the reflow temperature.

A process of the present invention for reflow mounting an electronic component on a mounting board comprises the steps of: preparing a mounting board including a terminal electrode for external connection and a mounting land for mounting an electronic component thereon; coating the mounting land with a first solder having a first melting point lower than a reflow temperature; coating the terminal electrode with a solder repelling material at a selected dividing area effective for dividing the terminal electrode into a plurality of sections substantially isolated from each other for solder flow; coating the terminal electrode with a second solder at the sections divided and isolated by the solder repelling material; placing the mounting board, with the electronic component placed on the mounting land, on a conveyor which may be brought into contact with the second solder on the terminal electrode; and heating the mounting board together with the electronic component thereon to the reflow temperature. The solder repelling material may be a solder resist and the selected dividing area may be substantially T-shaped.

A mounting board of the present invention for reflow mounting an electronic component on a conveyor which may be brought into contact with the mounting board comprises: an electrically insulating substrate; a terminal electrode disposed on the substrate for external connection and a mounting land disposed on the substrate for mounting an electronic component; a first solder disposed on the mounting land, the first solder having a first melting point lower than a reflow temperature; a solder repelling material disposed on the terminal electrode at a selected dividing area effective for dividing the terminal electrode into a plurality of sections substantially isolated from each other for solder flow; and a second solder disposed on the terminal electrode at the sections divided and isolated by the solder repelling material.

A process of the present invention for reflow mounting an electronic component on a mounting board comprises the steps of: preparing a mounting board including a terminal electrode for external connection and a mounting land for mounting an electronic component; coating the mounting land with a first solder having a first melting point lower than a reflow temperature; coating the terminal electrode with a second solder; placing the mounting board, with the electronic component placed on the mounting land, on a mounting jig for supporting the mounting board without bringing the second solder on the terminal electrode into contact with the mounting jig; placing the mounting jig on which the mounting board is placed on a conveyor; and heating the mounting board together with the electronic component thereon to the reflow temperature. The mounting jig may be a plate having a positioning recess in which the mounting board is received and a relief recess for receiving the terminal electrode without bringing the second solder into contact with the mounting jig plate.

A mounting jig of the present invention for use in a process for reflow mounting an electronic component on a mounting board including a terminal electrode for external connection and a mounting land for mounting an electronic component comprises: a base plate for placing on a conveyor; a positioning recess in the base plate for receiving the mounting board; and a relief recess in the positioning recess for receiving the terminal electrode without contact between solder on the terminal electrode and the mounting jig plate.

BRIEF DESCRIPTION OF THE DRAWINGS

The present invention will become more readily apparent from the following detailed description of the preferred embodiments of the present invention taken in conjunction with the accompanying drawings, in which.

DESCRIPTION OF THE PREFERRED EMBODIMENTS

Figure 1:
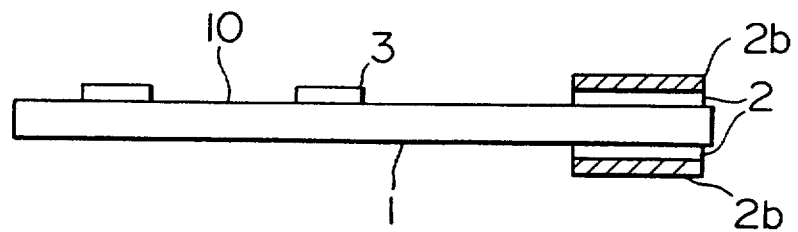
FIG. 1 is a sectional side view of the electronic component mounting board of one embodiment of the present invention.
Figure 3:
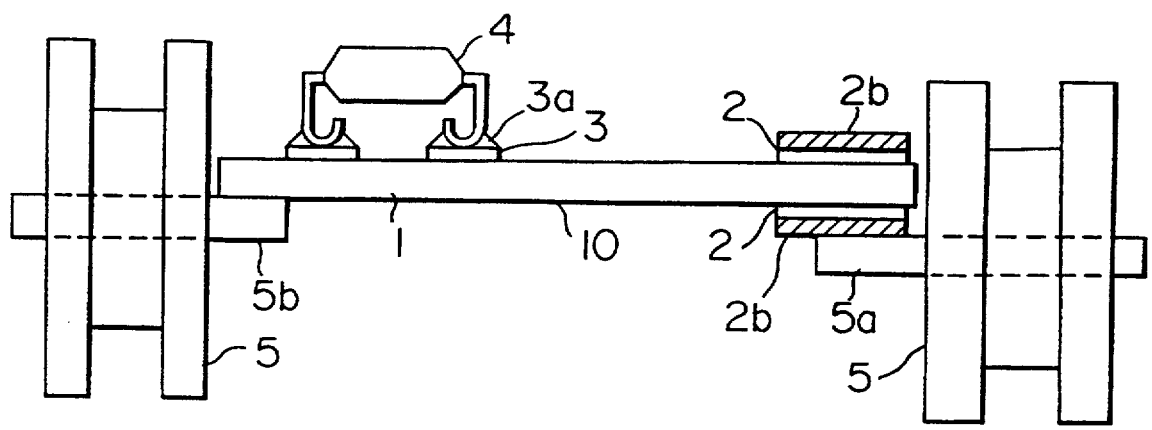
FIG. 3 is a sectional side view of the mounting board placed on a conveyor during a reflow mounting process.

FIG. 1 illustrates a mounting board 10 of one embodiment of the present invention for mounting electronic components such as IC packages. The mounting board 10 comprises a substantially rectangular, electrically insulating substrate 1, a plurality of terminal electrodes 2 disposed on the major surfaces of the substrate 1 for external connection and a plurality of mounting lands 3 disposed on one of the major surfaces of the substrate 1 for mounting an electronic component (see FIG. 3). Although not illustrated, the terminal electrodes 2 and the mounting lands 3 are electrically connected by a suitable conductor to define an electrical circuit on the substrate 1. Each of the terminal electrodes 2 is coated with a solder layer 2b formed by the hot leveller process or the electrolyte plating method for the main purpose of protecting the terminal electrodes 2 against corrosion.

Figure 2:
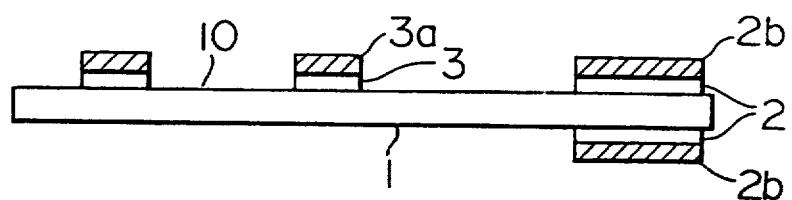
FIG. 2 is a sectional side view similar to FIG. 1 but illustrating a solder paste for reflow mounting electronic components disposed on the mounting lands.

As shown in FIG. 2, when it is desired to mount electronic components (see FIG. 3) such as IC packages on the mounting lands 3 by the reflow process, each of the mounting lands 3 is coated with a first solder paste layer 3a suitable for the reflow process. The first solder paste layer 3a has a first melting point of about 183° C. which is lower than the reflow temperature which is between 190° C. and 210° C. the peak temperature. As described above, each of the terminal electrodes 2 is coated with a second solder layer 2b having a second melting point of about from 290° C. to 300° C. The first solder paste contains a solder of Sn 40% and Pb 60% with a small amount of flux claim 4, and the second solder contains 5% Sn, 2.5% Ag and 92.5% Pb.

Figure 10:
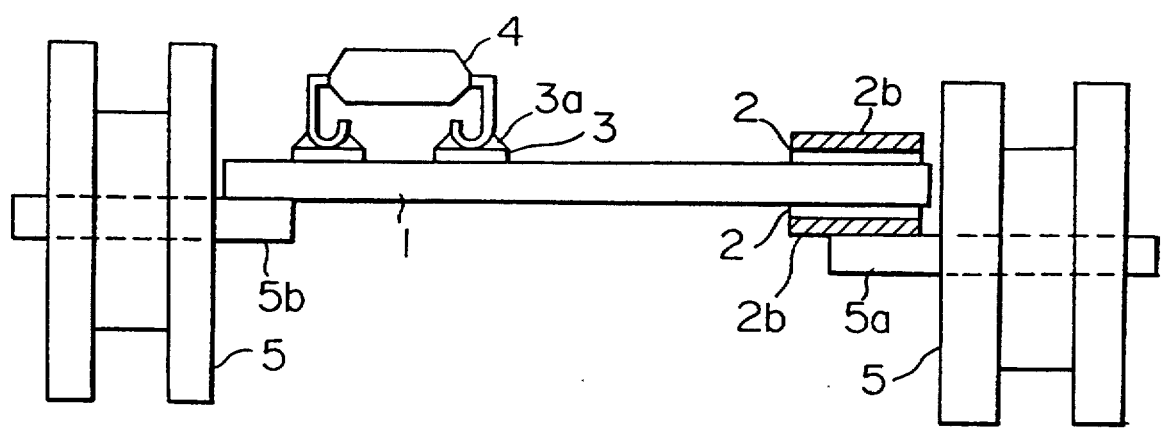
FIG. 10 is a sectional side view of the mounting board placed on the conveyor during the reflow mounting process.

When it is desired to mount the electronic components 4 on the mounting board 10, as illustrated in FIG. 10, the electronic components 4 are placed on the first solder layer 3a of the respective mounting lands 3 and the mounting board is placed on support pins 5a and 5b of a chain conveyor 5. It is seen from FIG. 10 that the support pins 5a are brought into contact with the protective second solder 2b on the terminal electrodes 2 on the bottom side of the insulating substrate 1. The support pins 5b directly engage the bottom major surface of the insulating substrate 1.

As the mounting board on which the electronic components 4 are placed is passed through a reflow heating station and heated by a flow of hot air to about 190° C. to 210° C. at peak temperature, the first solder layers 3a between the mounting lands 3 and the electronic components 4 melt, are cooled, and solidify, thereby electrically and mechanically connecting leads of the electronic components 4 on the mounting lands 3 on the mounting board.

During this reflow heating process, the protective second solder layers 2b which are on the terminal electrodes 2 do not melt because the melting point of this second solder layer 2b is higher than the reflow temperature which usually is about 190° C. to 210° C. at the peak temperature. Therefore, although the mounting board 10 is supported by the support pins 5a and 5b of the chain conveyor 5 and some of the support pins 5a are brought into contact with the second solder layers 2b on the terminal electrodes 2, the surfaces of the second solder layers 2b are intact and no local concentration occurs. Therefore, the thickness of the mounting board is the same from one board to another and exhibits a good appearance which increases the commercial value of the circuit boards. Accordingly, difficult manual reworking which has been necessary with the conventional mounting board is not required.

Figure 4:
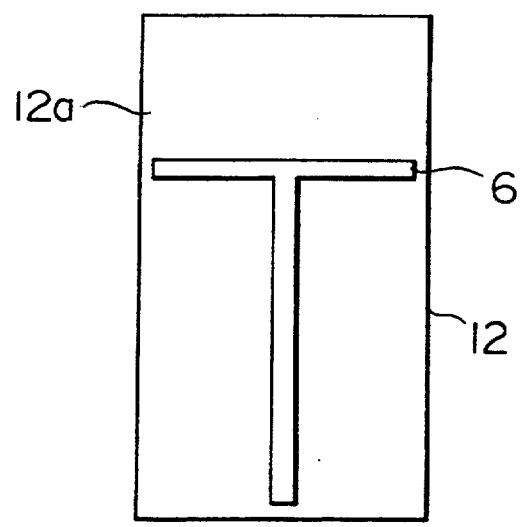
FIG. 4 is an enlarged plan view of the terminal electrode of the mounting board of another embodiment of the present invention.

FIG. 4 illustrates one example of a terminal electrode 12 of the mounting board of the present invention. In this embodiment, the mounting board comprises, in addition to the first solder layer 3a disposed on the mounting land 3, a solder repelling material 6 such as a solder resist applied on the terminal electrode 12. The solder repelling material 6 is applied in a substantially T-shape, selected area effective for dividing the terminal electrode 12 into a plurality of sections substantially isolated from each other in terms of a flow of a second solder 12a. Then, a second solder layer 12a is applied to the terminal electrode 12 at the sections divided and isolated by the T-shaped solder repelling material 6. In the illustrated example, the bar and the leg of the "T" have a width of about from 0.1 mm to 0.2 mm as against the overall dimensions of the terminal electrode of about 3 mm×5 mm. The material, the shape and the dimensions of the solder-repelling material 6 may be suitably modified as long as the flow or the movement of the second solder 12a between the divided sections can be prevented.

In this embodiment, even when the molten solder 12a is brought into contact with the support pins 5a of the conveyor 5, the solder 12a is not allowed to move between the sections divided by the solder repelling material 6, so that the problem of undesirable local concentration of the solder does not occur.

Figure 5:
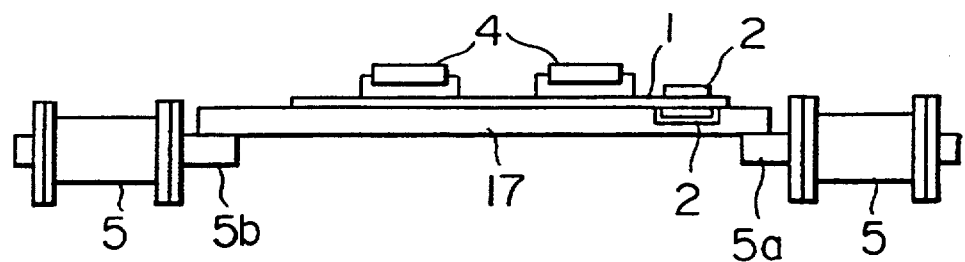
FIG. 5 is a sectional side view of the mounting board received in the mounting jig on the conveyor during the reflow mounting process.
Figure 6:
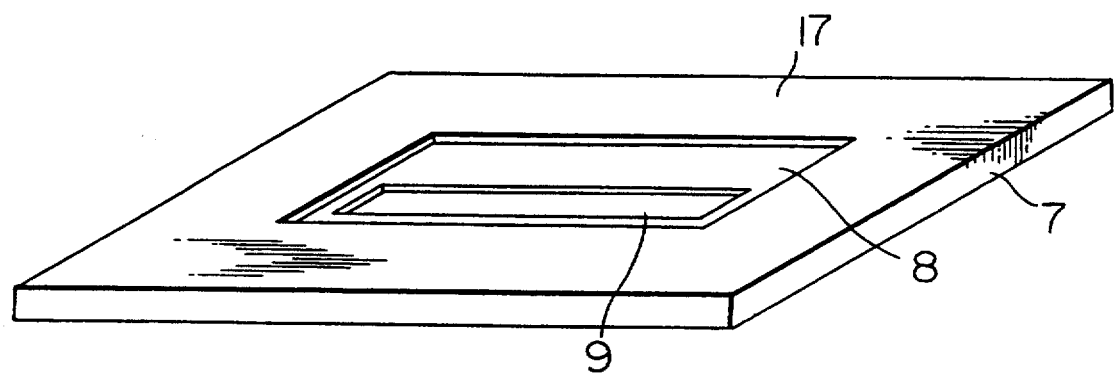
FIG. 6 is a perspective view of the mounting jig shown in FIG. 5.
Figure 7:
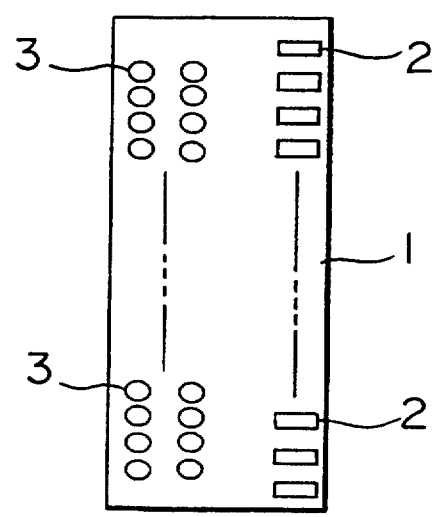
FIG. 7 is a plan view of the mounting board having terminal electrodes and mounting lands.
Figure 8:
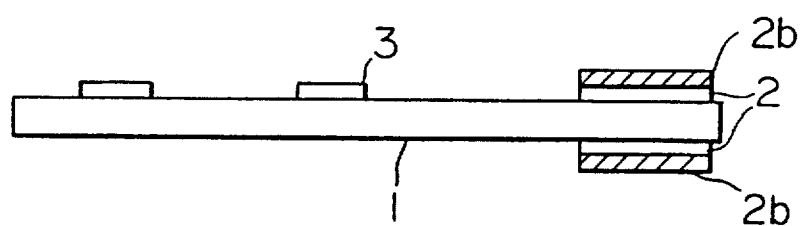
FIG. 8 is a sectional side view taken along line VIII—VIII of FIG. 7.
Figure 9:
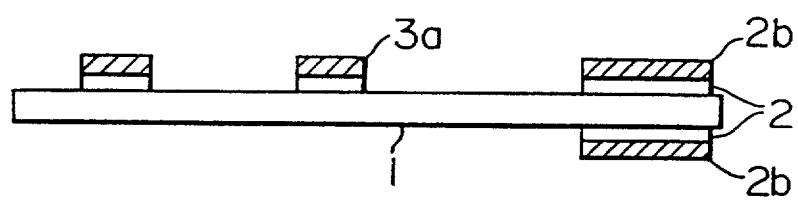
FIG. 9 is a sectional side view similar to FIG. 8 but illustrating a solder paste applied to the mounting lands before the reflow process.

FIGS. 5 and 6 illustrate a mounting jig 17 for use in the reflow mounting. As best shown in FIG. 6, the mounting jig 17 comprises a substantially rectangular base plate 7 made for example of a stainless steel for placing on a conveyor 5 as illustrated in FIG. 5. The base plate 7 has a rectangular positioning recess 8 for receiving the mounting board 1. The positioning recess 8 has therein a relief recess 9 for receiving the terminal electrodes 2 without bringing the solders 2a on the terminal electrodes 2 into contact with the mounting jig plate 17. According to this embodiment, any type of mounting board, including the conventional mounting board shown in FIGS. 8 and 9, can be used without fear of degrading the quality of the terminal electrodes. Also, the entire mounting board and the electrode portions are evenly heated and cooled at a uniform temperature.

What is claimed is:

1. A mounting board for reflow mounting an electronic component on said mounting board disposed on a conveyor which may contact the mounting board comprising:

an electrically insulating substrate;

a terminal electrode disposed on said substrate for external connection and a mounting land disposed on said substrate for mounting an electronic component;

a first solder disposed on said mounting land, said first solder having a first melting point lower than a reflow temperature; and a second solder disposed on said terminal electrode, said second solder having a second melting point higher than the reflow temperature.

2. The mounting board as claimed in claim 1 wherein the first melting point is 183° C., the second melting point is between 290° C. and 300° C., and the reflow temperature is from 190° C. to 210° C.

3. The mounting board as claimed in claim 1 wherein said first solder contains a solder paste including a solder including 40% Sn and 60% Pb and a flux, and said second solder contains 5% Sn, 2.5% Ag, and 92.5% Pb.

4. A mounting board for reflow mounting an electronic component on said mounting board disposed on a conveyor which may contact the mounting board comprising:

an electrically insulating substrate;

a terminal electrode disposed on said substrate for external connection and a mounting land disposed on said substrate for mounting an electronic component;

a first solder disposed on said mounting land, said first solder having a first melting point lower than a reflow temperature;

a solder repelling material disposed on said terminal electrode at a selected dividing area, dividing said terminal electrode into a plurality of sections substantially isolated from each other for solder flow; and a second solder disposed on said terminal electrode at said sections divided and isolated by said solder repelling material.

5. The mounting board as claimed in claim 4 wherein said solder repelling material is a solder resist.

6. The mounting board as claimed in claim 4 wherein said selected dividing area is substantially T-shaped.

* * * * *